(12) United States Patent
Kwak

(10) Patent No.: US 7,057,431 B2
(45) Date of Patent: Jun. 6, 2006

(54) DIGITAL DLL APPARATUS FOR CORRECTING DUTY CYCLE AND METHOD THEREOF

(75) Inventor: Jong-Tae Kwak, Kyoungki-do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 562 days.

(21) Appl. No.: 10/331,412

(22) Filed: Dec. 30, 2002

(65) Prior Publication Data

US 2003/0219088 A1 Nov. 27, 2003

(30) Foreign Application Priority Data

May 21, 2002 (KR) ................................ 2002-28129

(51) Int. Cl.
*H03L 7/06* (2006.01)
(52) U.S. Cl. ...................................... 327/158; 327/175
(58) Field of Classification Search ................ 327/149, 327/150, 158, 159, 161, 162, 172, 175
See application file for complete search history.

(56) References Cited

U.S. PATENT DOCUMENTS

| | | | | |
|---|---|---|---|---|
| 5,757,218 | A * | 5/1998 | Blum | 327/175 |
| 5,808,498 | A | 9/1998 | Donnelly et al. | 327/255 |
| 5,883,534 | A | 3/1999 | Kondoh et al. | |
| 6,043,677 | A | 3/2000 | Albu et al. | |
| 6,087,868 | A * | 7/2000 | Millar | 327/156 |
| 6,137,328 | A | 10/2000 | Sung | |
| 6,157,238 | A | 12/2000 | Na et al. | 327/297 |
| RE37,452 | E | 11/2001 | Donnelly et al. | 327/255 |
| 6,452,432 | B1 * | 9/2002 | Kim | 327/158 |
| 6,677,792 | B1 * | 1/2004 | Kwak | 327/158 |
| 6,853,225 | B1 * | 2/2005 | Lee | 327/158 |
| 6,895,522 | B1 * | 5/2005 | Johnson et al. | 713/401 |
| 6,897,693 | B1 * | 5/2005 | Kim | 327/158 |
| 2001/0026183 | A1 | 10/2001 | Kim | |

FOREIGN PATENT DOCUMENTS

JP 11-353878 12/1999

(Continued)

OTHER PUBLICATIONS

Notice for Preliminary Rejection for Application No. 2002-28129 dated Jul. 29, 2004.

(Continued)

*Primary Examiner*—Timothy P. Callahan
*Assistant Examiner*—Hai L. Nguyen
(74) *Attorney, Agent, or Firm*—Marshall, Gerstein & Borun LLP

(57) ABSTRACT

A digital DLL apparatus and a method for correcting a duty cycle are disclosed. The apparatus includes: a delay line unit for receiving external clock signal and generating first and second delayed internal clock signals by delaying the external clock signal; a duty error controller for receiving the first and second delayed clock signals and outputting a first duty controlled clock signal and second duty controlled clock signal by shifting edges of the first and second delayed internal clock signals; and a delay model unit for compensating a delay of the duty controlled clock signal by estimating a delay amount of system. The present invention can correct the duty error by using the phase mixer and generate an internal clock signal having 50% of duty cycle.

20 Claims, 9 Drawing Sheets

FOREIGN PATENT DOCUMENTS

| | | |
|---|---|---|
| JP | 2001-006399 | 1/2001 |
| KR | 2000-0009099 | 2/2000 |
| KR | 2001-0048682 | 6/2000 |
| WO | WO-01/01266 A1 | 1/2001 |

OTHER PUBLICATIONS

German Office Action for Application No. 103 00 540.4 dated Nov. 26, 2004.

* cited by examiner

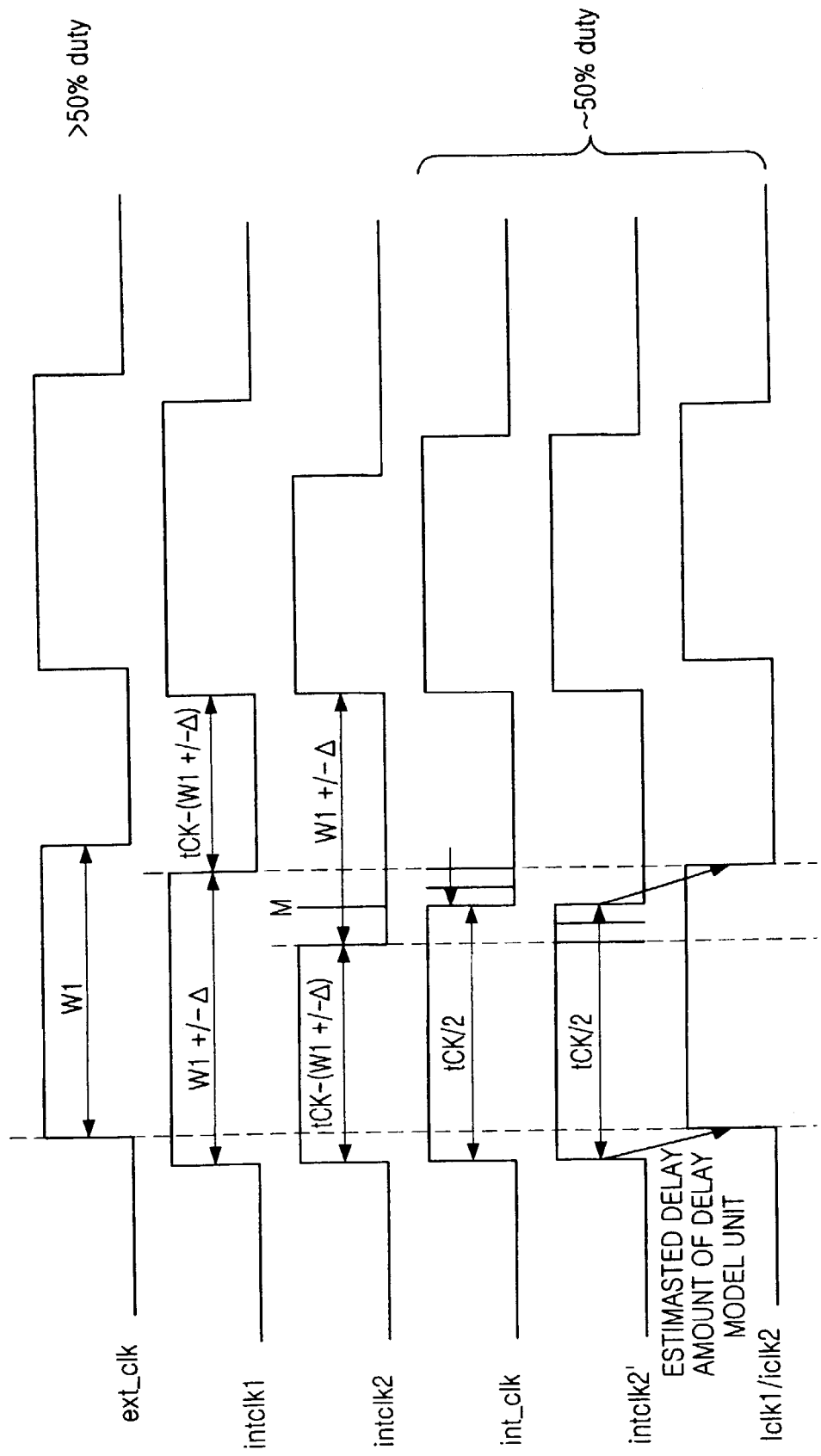

DIGITAL DLL APPARATUS FOR CORRECTING DUTY CYCLE AND METHOD THEREOF

TECHNICAL FIELD

A digital delay locked loop DLL circuitry and a method for correcting a duty cycle are disclosed. More particularly, a digital DLL apparatus and a method for correcting a duty cycle are disclosed which are used in a semiconductor or a computer system which needs a clock generator for compensating a skew between an external clock and internal clock.

DESCRIPTION OF RELATED ART

A delay locked loop (DLL) is widely used in a synchronous random access memory (RAM) for synchronization an external clock signal and an internal clock signal. In the synchronous RAM, all operations such as write or read are supposed to be operated at a rising edge. However, certain elements of a semiconductor device results in a timing delay. For synchronizing operation timing at the rising edge in the synchronous RAM, the timing delay must be eliminated. The delay locked loop (DLL) circuit receives the external clock signal and generates the internal clock signal for synchronizing two signals in order to eliminate the timing delay.

Various techniques of the DLL circuit have been introduced for controlling and eliminating the timing delay.

At first, Kwang Jin Na et al. disclose "Clock system of a semiconductor memory device employing a frequency amplifier" at U.S. Pat. No. 6,157,238 on Dec. 5, 2000 (hereinafter the Kwang patent). The Kwang patent includes a frequency amplifier for amplifying an external clock signal to produce an inner clock signal whose frequency is two multiples of that of the external clocks signal. The frequency amplifier contains a delay circuit for producing a phase-delayed clock signal based on the external clock signal; a logic device coupled to said delay circuit for generating the inner clock signal based on the external clock signal and the phase-delayed clock signal; a buffer coupled to said logic device for buffering the inner clock signal and providing a buffered clock signal. The Kwang patent produces a high-speed clock signal based on a low-speed clock signal inputted from the outside.

Secondly, Donnelly et al. teaches "a frequency phase shifting circuit for use in a quadrature clock generator" at U.S. Pat. No. 5,808,498, issued on Sep. 15, 1998 (hereinafter the Donelly patent). The Donelly patent includes a first differential amplifier composed of a pair of field effect transistors configured to form a source coupled pair having a common node, and including a pair of inputs for receiving an input reference signal and complement thereof and a pair of output nodes; first and second current sources coupled respectively between the output nodes and a first supply rail, the first and second current sources sourcing a current value of 1 amperes; and a third current source coupled between the common node and a second supply rail, the first and second current sources sourcing a current value sinking a current value of 21 amperes; a filter circuit coupled across the output nodes, the filter circuit causing the output nodes of the differential amplifier to produce a pair of complementary triangle wave signals in response to the input reference signal and complement thereof; and a comparator having a pair of inputs coupled to receive the pair of complementary triangle wave signals, the comparator generating an input signal having a predetermined phase relationship with the input reference signal in response to a comparison between the pair of complementary triangle wave signals.

Third, Japanese patent application (laid open) 2001-6399 discloses a semiconductor device employing a phase controller for controlling a phase of an external clock and generating an internal clock, including: a detector for detecting a frequency of an external clock, which is out of a phase controlling range of a phase frequency; a first and second operation modes being switched by a control signal inputted form the outside; and, an output circuit for outputting a certain signal without considering a result of the detector in the first operation mode and for outputting a certain signal by considering a result of the detector in the second operation mode.

Finally, the Japanese patent application (laid open) H11-353878 discloses a semiconductor device having a clock phase controlling circuit for generating a second clock, which is delayed as much as a certain phase according to an external clock by controlling a phase of inputted first clock and outputting data synchronized with one of the first clock or second clock, including a clock frequency analyzer for analyzing a frequency of the first clock by responding a signal representing a delay value of the first clock in the clock phase controlling circuit and a clock selector for selecting one of the first clock and the second clock by responding the control signal.

The above-mentioned conventional DLLs used in the DDR memory control a delay of whole phase based on a standard signal and compensated signal. However, their conventional DLLs cannot correct a phase delay caused by a duty error when data of external clock signal is processing, wherein the duty error is difference between real duty cycle and 50% duty cycle and it may be occurred during processing the external clock.

SUMMARY OF THE DISCLOSURE

Therefore, a DLL apparatus and a method for correcting a duty error are disclosed which use a phase mixer in order to generate an internal clock having 50% of a duty cycle.

In accordance with this concept, a digital DLL apparatus for correcting a duty cycle comprises: a buffer for orderly outputting a first internal clock signal which is activated at an edge of clock by receiving an external clock signal; a delay line unit for receiving the first internal clock signal from the buffer, a first detection signal and a second detection signal and outputting a first delayed internal clock signal and second delayed internal clock signal by delaying the first internal clock signal as much as a predetermined time according to the first and second detection signals; a duty error controller for receiving the first and second delayed internal clock signals and outputting a first duty controlled clock signal and second duty controlled clock signal by shifting each edge of the first and second delayed internal clock signals in order to match; a first delay model unit for estimating a delay amount generated during the first duty controlled clock signal travels to a data input/output pin and outputting a first compensated clock signal by compensating the first duty control clock signal based on the estimated delay amount; a first direct phase detector for receiving the external clock signal, generating a first detection signal by comparing the external clock signal and the first compensated clock signal and outputting the first detection signal to the delay line unit; a second delay model unit for estimating a delay amount generated during the second duty controlled clock signal travels to a data input/output pin and outputting a second compensated clock signal by compensating the first duty control clock signal based on the estimated delay amount; and a second direct phase detector for generating a second detection signal by comparing the external clock signal and the second compensate clock signal and outputting the second detection signal.

A disclosed method of correcting a duty cycle comprises: a) determining whether rising edges of an external signal and a first clock signal or a second clock signal are matched; b) selecting one signal having a preceded falling edge between a first delayed internal clock signal and a second delayed internal clock signal in case that the rising edges are matched; and c) applying a value less than 0.5 to a signal, which is not selected at step b) and applying a value more than 0.5 to a signal, which is selected at step b).

Another disclosed method for correcting duty cycle comprises: a) determining whether rising edges of an external signal and a first compensate signal or a second compensate signal are matched; b) determining whether falling edges of the second duty controlled clock signal and first duty controlled clock signal are matched in case that the rising edges are matched; and c) applying a value less than 0.5 to a signal having a falling edge is not preceded, applying a value more than 0.5 to a signal having a preceded falling edge and going back to the step b) in case the falling edges are not matched and ending the method in case that the falling edges are matched.

BRIEF DESCRIPTION OF THE DRAWINGS

The above and other concepts will become apparent from the following description of the preferred embodiments given in conjunction with the accompanying drawings, wherein:

FIG. 2 is a timing diagram explaining operations of the digital DLL apparatus for correcting the duty cycle in accordance with a preferred embodiment;

DETAILED DESCRIPTION OF THE PRESENTLY PREFERRED EMBODIMENTS

Figure 1A:
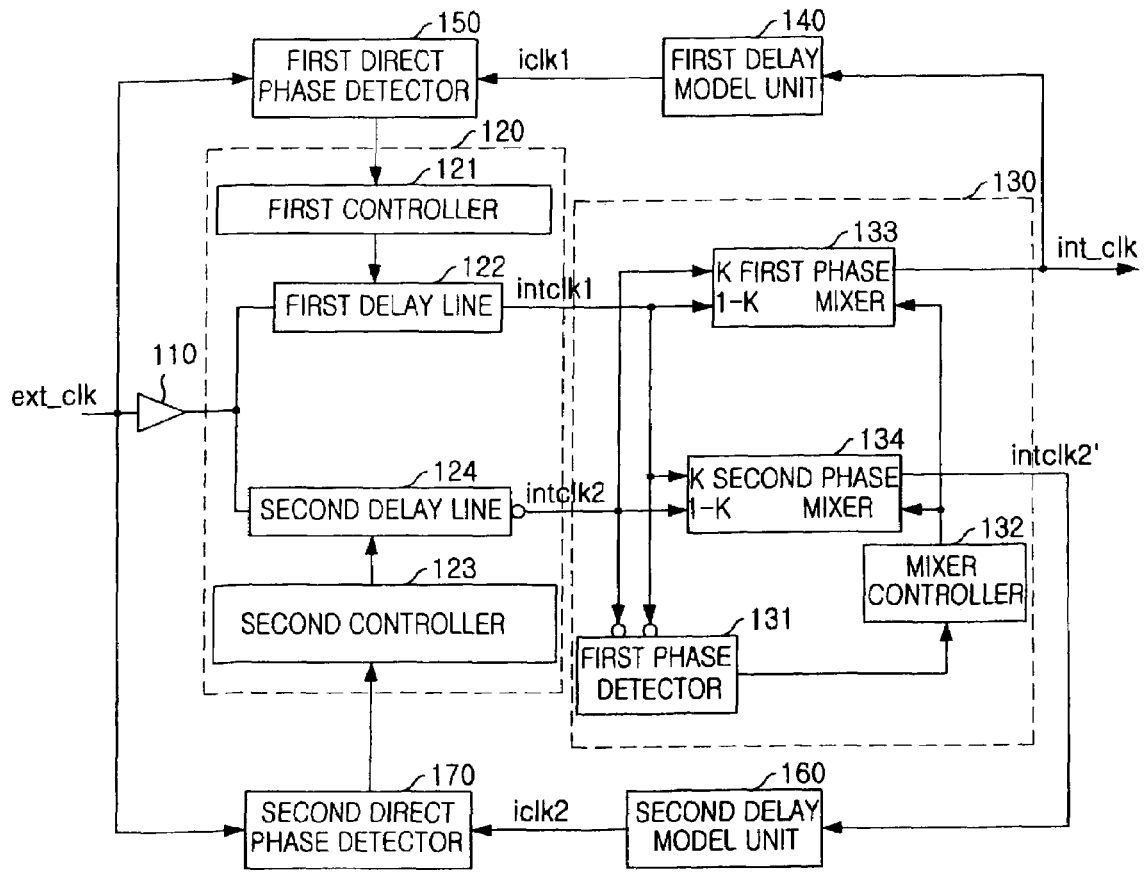
FIGS. 1A and 1B are block diagrams illustrating a digital DLL apparatus for correcting a duty cycle in accordance with a preferred embodiment.

FIG. 1A is a block diagram showing a digital DLL apparatus for correcting a duty cycle in accordance with a preferred embodiment. The digital DLL apparatus includes a buffer 110, a delay line unit 120, a duty error controller 130, a first delay model unit 140, a first direct phase detector 150, a second delay model unit 160 and a second direct phase detector 170.

The buffer 110 receives an external clock signal (ext_clk) and generates a first internal clock signal which becomes activated at an edge of a clock. The first internal clock signal is inputted to the delay line unit 120.

The delay line unit 120 receives the first internal clock signal and also receives a first and second detection signals from the first and second direct phase detector 150 and 170. The delay line unit 120 delays the first internal clock signal based on the first and second detection signals and outputs a first delay internal clock signal (intclk1) and a second delayed internal clock signal (intclk2) to the duty error controller 130.

The delay line unit 120 includes a first controller 121, a first delay line, a second controller 123 and a second delay line.

The first controller 121 generates a first control signal for controlling a delay amount according to the first detection signal and outputs the first control signal to the first delay line 122.

The delay line 122 receives the first control signal and the first internal clock signal. The first internal clock signal is delayed according to the first control signal in the delay line 122. That is, the delay line 122 generates the first delayed internal clock signal (intclk1) by delaying the first internal clock signal according to the first control signal. The first delayed internal clock signal intclk1 is outputted to the duty error controller 130.

The second controller 123 generates a second control signal for controlling a delay amount according the second detection signal and output the second control signal to the second delay line 124.

The second delay line 124 receives the second control signal and the first internal clock signal. The second delay line 124 delays the first internal clock signal based on the second control signal. By delaying the first internal clock signal, the second delay line 124 generates a second delayed internal clock signal. The second delay clock signal is reversed and a reversed second delayed internal clock signal (intclk2) is outputted to the duty error controller 130.

The duty error controller 130 receives the intclk1 and the intclk2. The duty error controller 130 generates a first duty controlled clock signal int_clk and a second duty controlled clock signal intclk2' by matching falling edges of the int_clk and the intclk2'. The first and second duty controlled cock signals int_clk and intclk2' are outputted to the delay model units 140 and 160. The first duty controlled clock signal int_clk is also outputted to the DLL apparatus of the present invention as an internal clock signal of a memory system, which includes the DLL apparatus of the present invention.

The duty error controller 130 includes a first phase detector 131, a mixer controller 132, a first phase mixer 133 and a second phase mixer 134.

The intclk1 and the intclk2 are reversed and inputted to the first phase detector 131. The first phase detector 131 selects one having preceded falling edge between the intclk1 and the intclk2 and generates a phase detection signal. The phase detection signal is outputted to the mixer controller 132.

The mixer controller 132 receives the phase detection signal and determines a weight k, which contains a difference between two falling edges, intclk1 and intclk2, according to the phase detection signal. The weight k is outputted to the first and the second phase mixer 133 and 134. The weight includes the plural number of weight signals.

The first phase mixer 133 receives the weight k, intclk1 and intclk2. The first phase mixer 133 calculates a difference value by subtracting the weight k from 1. By applying the difference value to the first internal clock signal (intclk1) and applying the weight k to second internal clock signals (intclk2), the first phase mixer 133 generates a first duty controlled clock signal int_clk. The first duty controlled clock signal int_clk is outputted to the first delay model unit 140.

The second phase mixer 134 receives the weight k and calculates a difference value by subtracting the weight k from 1. The second phase mixer 134 generates a second duty controlled clock signal intclk2' by applying the weight k to the first clock signal intclk1 and applying the difference value to the second clock signal intclk2. The second phase mixer 134 outputs the second duty controlled clock signalintclk2' to the second delay model unit 160.

The first delay model unit 140 receives the first duty controlled clock signal(int_clk) and estimates a delay amount generated during the first duty controlled clock signal travels to a data input/output pin. The first delay model unit 140 generates a first compensated clock signal (iclk1) based on the estimated delay difference and outputs the first compensated clock signal to the first direct phase detector 150.

The first direct phase detector 150 receives the external clock signal (ext_clk) and generates the first detection signal by comparing the external clock signal (ext_clk) with the first compensated clock signal (iclk1). The first direct phase detector 150 outputs the first detection signal to the delay line unit 120.

The second delay model unit 160 receives the second duty controlled clock signal(intclk2') and estimates a delay amount generated during the second duty controlled clock signal travels to a data input/output pin. The second delay model unit 160 generates a second compensated clock signal (iclk2) based on the estimated delay difference and outputs the second compensated clock signal to the second direct phase detector 170.

The second direct phase detector 170 receives the external clock signal (ext_clk) and generates the second detection signal by comparing the external clock signal (ext_clk) and the second compensated clock signal (iclk2). The second direct phase detector 170 outputs the second detection signal to the delay line unit 120.

Figure 1B:
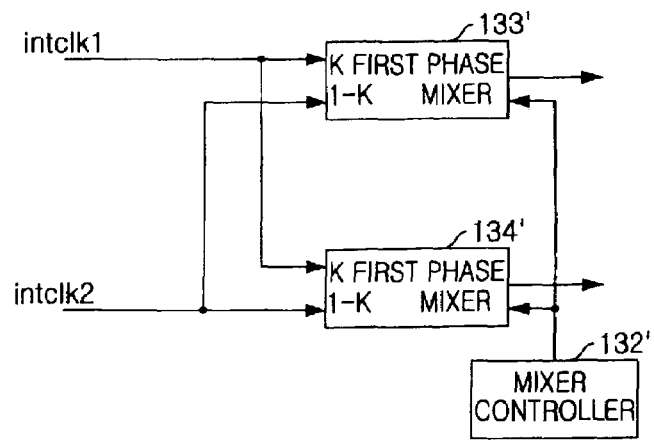

FIG. 1B shows another duty error controller in accordance with another preferred embodiment. Referring to FIG. 1B, the duty error controller includes a first phase mixer 133', a second phase mixer 134' and a mixer controller 132'. The first phase mixer creates the first duty controlled clock signal(int_clk) by applying the weight k from the mixer controller 132' to the first delayed internal clock signal intclk1 and applying the difference value 1−k to the second delayed internal clock signal intclk2. The above mentioned operation of the duty error controller in FIG. 1B is only difference comparing to the duty error controller in FIG. 1A. Other operations of the duty error controller in FIG. 1B are same with the duty error controller in FIG. 1A. Although the above mentioned difference is made at the duty error controller in FIG. 1B, the result of the apparatuses using the duty error controllers in FIGS. 1A and 1B is identical. FIG. 2 is a timing diagram explaining operations of the digital DLL apparatus correcting the duty cycle in accordance with a preferred embodiment. The operations of the digital DLL apparatus correcting the duty cycle is explained in detail as followings.

At first, if an external clock signal (ext_clk) is inputted through a buffer 110, the buffer outputs a first internal clock signal. A delay unit 120 creates a first and second delayed internal clock signal (intclk1 and inteclk2) by delaying the internal clocks signal. As shown in FIG. 2, a phase of a rising edge of the first delayed internal clock signal (intclk1) is identical to that of the second delayed internal clock signal (intclk2) but a phase of a falling edge of the first delayed internal clocks signal (intclk1) may be different from that of the second delayed internal clocks signal (intclk2) to thereby causing a duty distortion. The first delayed internal clock signal (intclk1) is inputted to a first phase detector 131 and the first phase detector 131 detects a phase difference between the first delayed internal clocks (intclk1) and the second delayed internal clock signal (intclk2). A mixer controller 132 receives the phase difference and generates a weight (k) based on the phase difference for shifting the falling edges of the first delayed internal clock signal and the second delay internal clock signal. That is, the weight (k) is controlled for shifting two falling edges of intclk1 and intclk2 to a point M, which is middle of two falling edges of intclk1 and intclk2. Referring to FIG. 2, more weight needs to be given to the second delayed internal clock signal (intclk2) than the first delayed internal clock signal (intclk1) for compensating the phase difference of two falling edges of intclk1 and intclk2. In a case shown in FIG. 2, the weight given to the second delayed internal clock (intclk2) is generally more than 0.5 and exact value of the weight can be gained by simulation.

A value of weight (k) is initially set to 0 and it gradually increases little by little from a moment that phases of rising edges of a first compensated clock signal (iclk1) and a second compensated clock signal (iclk2) are matched to a rising edge of the external clock signal (ext_clk). Whenever the weight (k) increase, the falling edge of the first duty controlled clock signal(int_clk) outputted from a first phase mixer 133 is shifted to the point M little by little and the falling edge of the second duty controlled clock signal (intclk2') outputted from a second phase mixer 134 is also shifted to the point M little by little. By above mentioned operations, the first duty controlled clock signal becomes an internal clock signal having 50% duty cycle. The second duty controlled clock signal(intclk2') is used for generating the second delayed internal clock signal (intclk2).

As mentioned above, for shifting the falling edges of intclk1 and intclk2 at the first and second phase mixers 133 and 134, the weight value more that 0.5 must be given to intclk2. If the falling edge of the second delayed internal clock signals (intclk2) is preceded by the rising edge of the first delayed internal clock signal (intclk1), the weight (k) of the first phase mixer 133 may be set up as 0.6 and the weight (k) of the second phase mixer 134 may be set up as 0.4. In the above-mentioned case, the weight of 0.6 is applied to an input of the second delayed internal clock signal (intclk2) and the weight of 0.4 (=1−0.6) is applied to the first delayed internal clock signal (intclk1) in the first phase mixer 133. Undoubtedly, in the second phase mixer 134, the weight of 0.4 is applied to an input of the first delayed internal clock signal (intclk1) and the weight of 0.6 (=1−0.4) is applied to the second delayed internal clock signal (intclk2). In the above-mentioned case, since the rising edges of intclk1 and intclk2 have identical phase, the rising edges of intclk1 and intclk2 is not compensated. However, if the rising edges of intclk1 and inclk2 are different then they are compensated to match the two falling edges. Therefore, the commonly experienced "jitter" may be reduced by half™ comparing to the jitter of one delay line.

Figure 3:
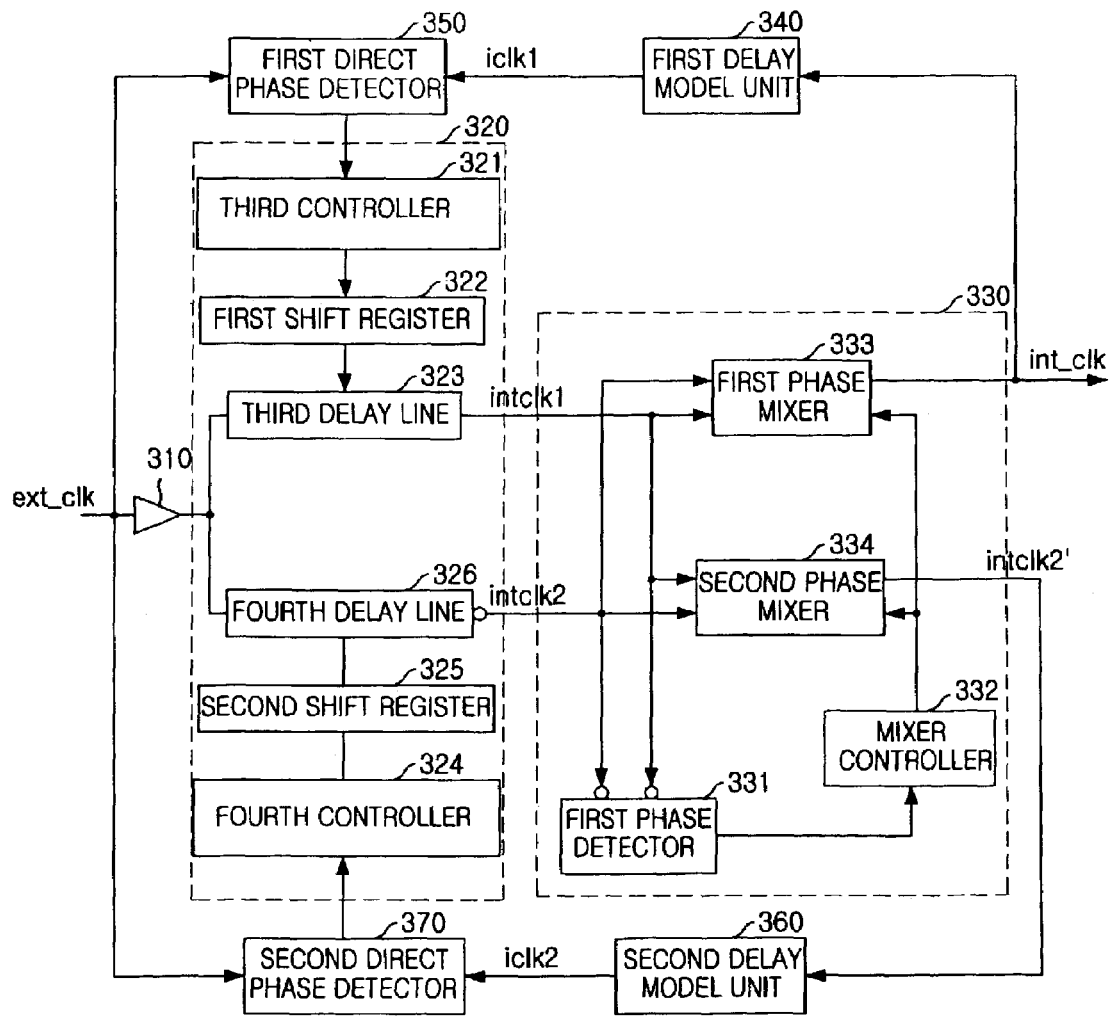
FIG. 3 is a diagram depicting a digital DLL apparatus for correcting a duty cycle in accordance with another embodiment.

FIG. 3 is a block diagram illustrating a digital DLL apparatus for correcting a duty cycle in accordance with another embodiment. The digital DLL apparatus includes a buffer 310, a delay line unit 320, a duty error controller 330, a first delay model unit 340, a first direct phase detector 350, a second delay model unit 360 and a second direct phase detector 370.

The buffer 310 receives an external clock signal (ext_clk) and generates a first internal clock signal which becomes activated at an edge of a clock. The first internal clock signal is inputted to the delay line unit 120.

The delay line unit 320 receives the first internal clock signal and also receives a first and second detection signals from the first and second direct phase detector 350 and 370. The delay line unit 120 delays the first internal clock signal based on the first and second detection signals and outputs a first delay internal clock signal (intclk1) and a second delayed internal clock signal (intclk2) to the duty error controller 330.

The delay line unit 320 includes a third controller 321, a first shift register 322, a third delay line 323, a fourth controller 324 and a second shift register 325 and a fourth delay line 326.

The third controller 321 produces a first shift signal for controlling a delay amount of the first internal clock signal according the first detection signal from the first direct phase detector 350. The first shift signal is outputted to the first shift register 322.

The first shift register 322 receives the first shift signal and generates a third control signal that controls a delay amount by moving an output signal to left or right. The third control signal is outputted to the third delay line 323.

The third delay line 323 receives the third control signal from the first shift register 322 and the first internal clock input signal from the buffer 310. The third delay line 323 creates a first delayed internal clock signal (intclk1) by delaying the first internal clock signal according to the third control signal and outputs the first delayed internal clock signal (intclk1) to the duty error control unit 330. In other words, the third delay line 323 includes a device having a plurality of unit delay cells, which are coupled in order. The delay amount is controlled by passing the first internal clock signal through a predetermined number of unit delay cells, wherein the predetermined number of unit delay cells are determined and controlled according to the third control signal outputted from the first shift register 322.

The fourth controller 324 produces a second shift signal for controlling a delay amount according to the second detection signal from the second direct phase detector 370. The second shift signal is outputted to the second shift register 325.

The second shift register 325 receives the second shift signal and produces a fourth control signal for controlling a delay amount by moving the output signal to left or right according to the second shift signal. The fourth control signal is outputted to the fourth delay line 326.

The fourth delay line 326 receives the fourth control signal and the first internal clock signal from the buffer 310. The fourth delay line 326 produces a second delayed internal clock signal by delaying the first internal clock signal according to the fourth control signal. After producing, the second delayed internal clock signal is reversed. A second reversed delayed internal clock signal (intclk2) is outputted to the duty error controller 330. That is, the fourth delay line 326 has a device composed of a plurality of unit delay cells, which are coupled in order. The delay amount is controlled by passing the clock input signal through a predetermined number of unit delay cells, wherein the predetermined number of unit delay cells are determined controlled according to the third control signal outputted form the second shift register 325.

The duty error controller 330 includes a first phase detector 331, a mixer controller 332, a first phase mixer 333 and a second phase mixer 334.

The duty error controller 330 receives the intclk1 and the intclk2 from the delay line unit 320 and generates a first duty controlled clock signal (int_clk) and a second duty controlled clock signal (intclk2') by shifting falling edges of the intclk1 and the intclk2. The first duty controlled clock signal (int_clk) is outputted to the first delay model unit 340 and the second duty controlled clock signal (intclk2') is outputted to the second delay model unit 360. The first duty controlled clock signal (int_clk) is also outputted to the DLL apparatus of the present invention as an internal clock signal of a memory system, which includes the DLL apparatus of the present invention.

The intclk1 and the intclk2 are reversed and inputted to the first phase detector 331. The first phase detector 331 selects one having preceded falling edge between the intclk1 and the intclk2 and generates a phase detection signal. The phase detection signal is outputted to the mixer controller 332.

The mixer controller 332 receives the phase detection signal and determines a weight k, which contains a difference between two falling edges, intclk1 and intclk2, according to the phase detection signal. The weight k is outputted to the first and the second phase mixer 333 and 334.

The first phase mixer 333 receives the weight k, intclk1 and intclk2. The first phase mixer 333 calculates a difference value by subtracting the weight k from 1. By applying the difference value to the first internal clock signal (intclk1) and applying the weight k to second internal clock signals (intclk2), the first phase mixer 333 generates a first duty controlled clock signal (int_clk). The first duty controlled clock signal int_clk is outputted to the first delay model unit 140.

The second phase mixer 334 receives the weight k and calculates a difference value by subtracting the weight k from 1. The second phase mixer 334 generates a second duty controlled clock signal (intclk2') by applying the weight k to the first clock signal intclk1 and applying the difference value to the second clock signal intclk2. The second phase mixer 334 outputs the second duty controlled clock signal (intclk2') to the second delay model unit 160.

The first delay model unit 340 receives the first duty controlled clock signal(int_clk) and estimates a delay amount generated during the first duty controlled clock signal travels to a data input/output pin. The first delay model unit 140 generates a first compensated clock signal (iclk1) based on the estimated delay difference and outputs the first compensated clock signal to the first direct phase detector 550.

The first direct phase detector 350 receives the external clock signal (ext_clk) and generates the first detection signal by comparing the external clock signal (ext_clk) with the first compensated clock signal (iclk1). The first direct phase detector 350 outputs the first detection signal to the delay line unit 320.

The second delay model unit 360 receives the second duty controlled clock signal(intclk2') and estimates a delay amount generated during the second duty controlled clock signal travels to a data input/output pin. The second delay model unit 360 generates a second compensated clock signal (iclk2) based on the estimated delay difference and outputs the second compensated clock signal to the second direct phase detector 370.

The second direct phase detector 370 receives the external clock signal (ext_clk) and generates the second detection signal by comparing the external clock signal (ext_clk) and the second compensated clock signal (iclk2). The second direct phase detector 370 outputs the second detection signal to the delay line unit 320.

Figure 4:
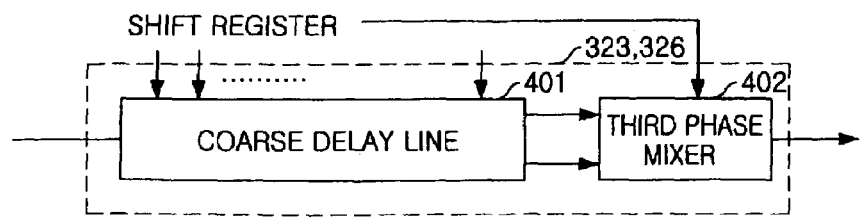
FIG. 4 is a block diagram showing delay line 323 and 326 of FIG. 3.

FIG. 4 is a block diagram showing the third and fourth delay lines 323 and 326 in FIG. 3 in accordance with the present invention. The third and fourth delay lines 323 and 326 include a coarse delay line 410 and a third phase mixer 402.

The coarse delay line 401 includes two lines of a plurality of unit delay cells, which are coupled in order. The coarse delay line 401 receives the first internal clock signal and the first internal clock signal becomes a first mixer input signal and a second mixer input signal by being separately inputted to each of two lines of a plurality of unit delay cells. Each of the first and second mixer input signals are passed a predetermined number of activated unit delay cells by the control signal from the first shift register 322. As a result, the first and second mixer input signals are differently delayed according to the number of activated unit delay cells. The first and second mixer input signals are outputted to the third phase mixer 402.

The third phase mixer 402 receives the first and second mixer input signals from the coarse delay line 401 and minutely tunes the delayed amount of two mixer input signals according to the control signals from the third and fourth controlling means 321 and 324.

Figure 5:
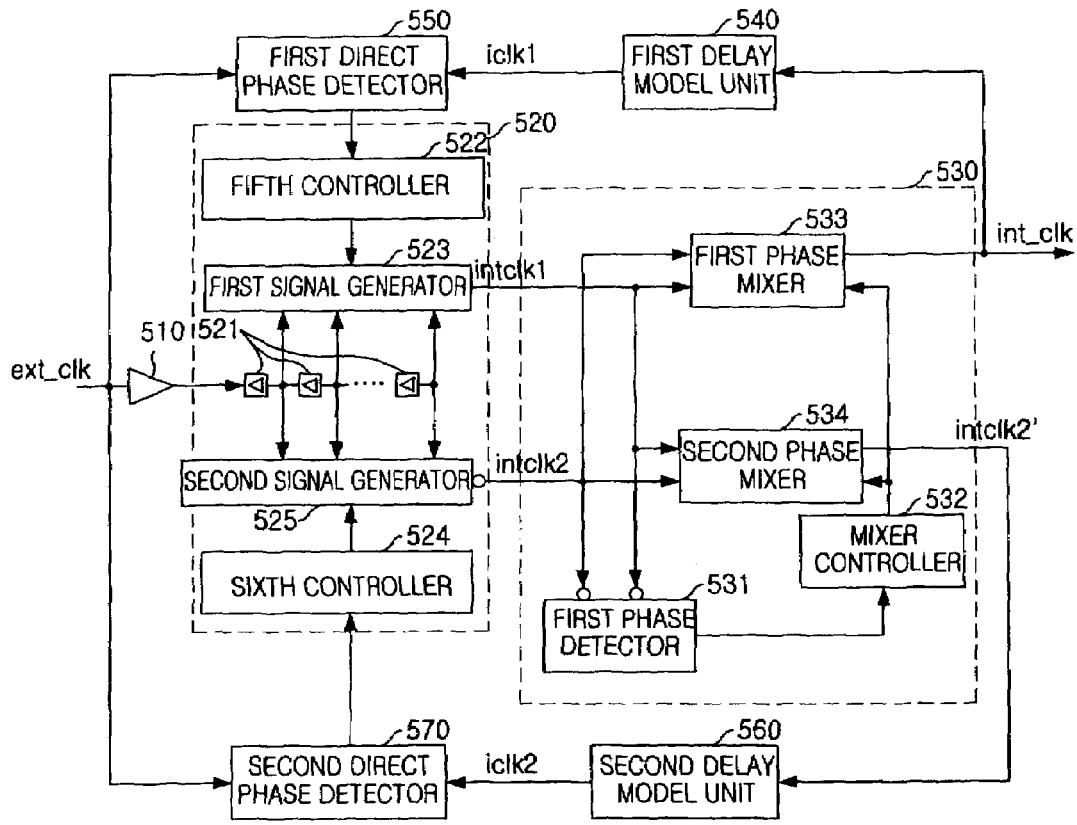
FIG. 5 is a block diagram illustrating a digital DLL apparatus for correcting a duty cycle in accordance with still another preferred embodiment.

FIG. 5 is a block diagram illustrating a digital DLL apparatus for correcting a duty cycle in accordance with still another preferred embodiment. The digital DLL apparatus includes a buffer 510, a delay line unit 520, a duty error controller 530, a first delay model unit 540, a first direct phase detector 550, a second delay model unit 560 and a second direct phases detector 570.

The buffer 510 receives an external clock signal (ext_clk) and generates a first internal clock signal which becomes activated at an edge of a clock. The first internal clock signal is inputted to the delay line unit 520.

The delay line unit 520 receives the first internal clock signal from the buffer 510, a first detection signals from the first direct phase detector 550 and a second detection signals from the second direct phase detectors 570. The delay line unit 520 delays the first internal clock signal based on the detection signals and outputs a first delayed internal clock signal, (intclk1) and a second delayed clock signal (intclk2) to the duty error controller 530.

The delay line unit 520 includes a plurality of delay cells 521, a fifth controller 522, a first signal generator 523, a sixth controller 524 and a second signal generator 525.

The plurality of delay cells 521 receives the first internal clock signal. The first internal clock signal is converted to a plurality of phase delayed signals by passing each of the plurality of delay unit cells 521. Each of a plurality of phase delayed signals has a delay difference as much as a delay amount of one unit delay cell. The plurality of phase delayed signals is outputted to the first and second signal generator 523 and 525.

The fifth controller 522 generates a fifth control signal for controlling a delay amount according to the detection signal from the first direct phase detector 550. The fifth control signal is outputted to the first signal generator 523.

The first signal generator 523 receives the fifth control signal and a plurality of the phase delayed signals from the plurality of delay cells 521. Based on the fifth control signal, the first signal generator 523 selects two neighbored phase delayed signals, which have a delay amount of one delay unit cell, based on the fifth control signal. The first signal generator 523 produces a first delayed internal clock signal (intclk1) by tuning the two neighbored phase delayed signals and outputs the first delayed internal clock signal (intclk1) to the duty error controller 530.

The sixth controller 524 produces a sixth control signal for controlling a delay amount according to the second detection signal from the second direct phase detector 570. The sixth control signal is outputted to the second signal generating means 525.

The second signal generator 525 receive the sixth control signal, a plurality of the phase delayed signals from the plurality of the delay cell units 521. Based on the sixth control signal, the second signal generator 525 selects two neighbored phase delayed signals, which have a delay difference as much as one delay unit cell. The two neighbored phase delayed signals are tuned and reversed for generating the second delayed internal clock signal (intclk2). The second delayed internal clock signal (intclk2) is outputted to the duty error controller 530.

The duty error controller 530 includes a first phase detector 531, a mixer controller 532, a first phase mixer 533 and a second phase mixer 534.

The duty error controller 530 receives the intclk1 and the intclk2 from the delay line unit 520 and generates a first duty controlled clock signal (int_clk) and a second duty controlled clock signal (intclk2') by shifting falling edges of the intclk1 and the intclk2. The first duty controlled clock signal (int_clk) is outputted to the first delay model unit 540 and the second duty controlled clock signal (intclk2') is outputted to the second delay model unit 560. The first duty controlled clock signal ($int_{13}$ clk) is also outputted to the DLL apparatus as an internal clock signal of a memory system, which includes the disclosed DLL apparatus.

The intclk1 and the intclk2 are reversed and inputted to the first phase detector 531. The first phase detector 531 selects one having preceded falling edge between the intclk1 and the intclk2 and generates a phase detection signal. The phase detection signal is outputted to the mixer controller 532.

The mixer controller 532 receives the phase detection signal and determines a weight k, which contains a difference between two falling edges, intclk1 and intclk2, according to the phase detection signal. The weight k is outputted to the first and the second phase mixer 533 and 534.

The first phase mixer 533 receives the weight k, intclk1 and intclk2. The first phase mixer 533 calculates a difference value by subtracting the weight k from 1. By applying the difference value to the first internal clock signal (intclk1) and applying the weight k to second internal clock signals (intclk2), the first phase mixer 533 generates a first duty controlled clock signal (int_clk). The first duty controlled clock signal int_clk is outputted to the first delay model unit 540.

The second phase mixer 534 receives the weight k and calculates a difference value by subtracting the weight k from 1. The second phase mixer 534 generates a second duty controlled clock signal (intclk2') by applying the weight k to the first clock signal intclk1 and applying the difference value to the second clock signal intclk2. The second phase mixer 534 outputs the second duty controlled clock signal (intclk2') to the second delay model unit 560.

The first delay model unit 540 receives the first duty controlled clock signal(int_clk) and estimates a delay amount generated during the first duty controlled clock signal travels to a data input/output pin. The first delay model unit 140 generates a first compensated clock signal (iclk1) based on the estimated delay difference and outputs the first compensated clock signal to the first direct phase detector 550.

The first direct phase detector 550 receives the external clock signal (ext_clk) and generates the first detection signal by comparing the external clock signal (ext_clk) with the first compensated clock signal (iclk1). The first direct phase detector 550 outputs the first detection signal to the delay line unit 520.

The second delay model unit 560 receives the second duty controlled clock signal(intclk2') and estimates a delay amount generated during the second duty controlled clock signal travels to a data input/output pin. The second delay model unit 560 generates a second compensated clock signal (iclk2) based on the estimated delay difference and outputs the second compensated clock signal to the second direct phase detector 570.

The second direct phase detector 570 receives the external clock signal (ext_clk) and generates the second detection signal by comparing the external clock signal (ext_clk) and the second compensated clock signal (iclk2). The second direct phase detector 570 outputs the second detection signal to the delay line unit 520.

Figure 6:
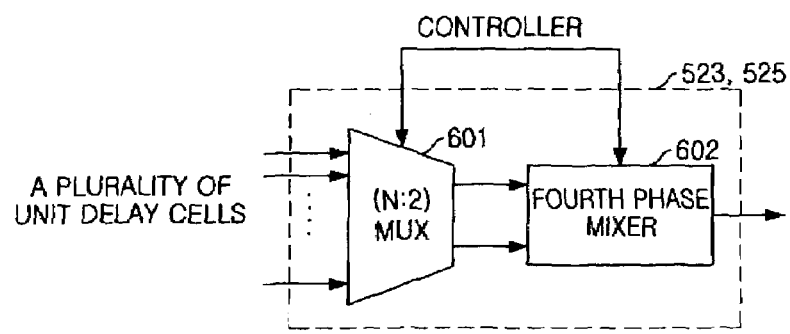
FIG. 6 is a block diagram showing the signal generating means 523 and 524 of FIG. 5.

FIG. 6 is a block diagram showing the first and second signal generators 523 and 524 of FIG. 5. The first and second signal generators 425 and 524 include a MUX 601 and a fourth phase mixer 602.

The MUX 601 receives a plurality of the phase delay signals and selects two neighbor phase delay signals among having a delay difference as much as one unit delay cell according to a control signal from the fifth and sixth controllers 522 and 524. The two neighbor signals are outputted to the fourth phase mixer 602 as a first mixer input signal and a second mixer input signal.

The fourth phase mixer 602 receives the first and second mixer input signals from the MUX 601 and minutely tunes the delay amount according to the control signals from the fifth and sixth controllers 522 and 524.

Figure 7:
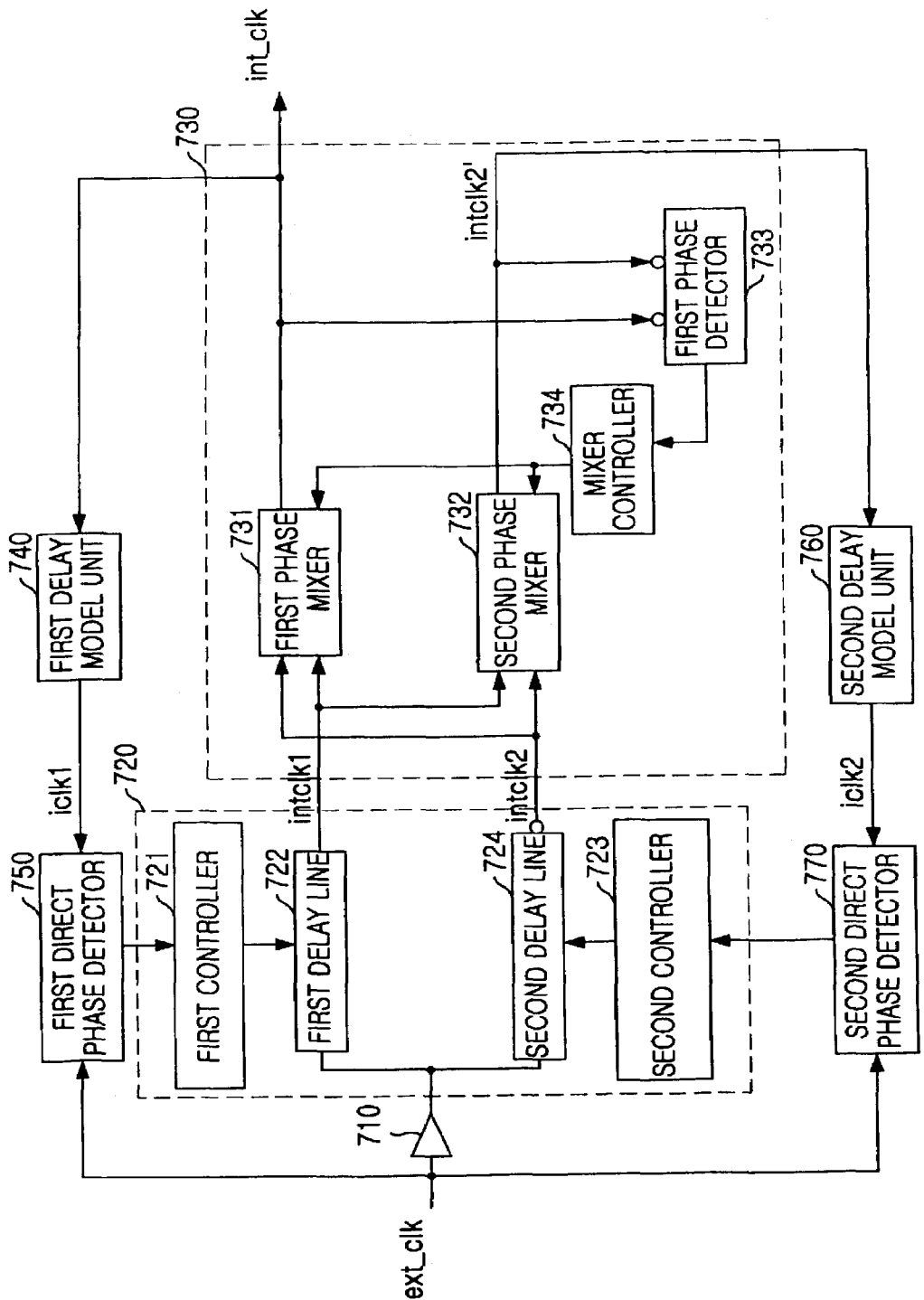
FIG. 7 is a block diagram illustrating a digital DLL apparatus for correcting a duty cycle in accordance with a further still another embodiment.

FIG. 7 is a block diagram illustrating a digital DLL apparatus for correcting a duty cycle in accordance with a further still another disclosed embodiment. The digital DLL apparatus includes a buffer 710, a delay line unit 720, a duty error controller 730, a first delay model unit 740, a first direct phase detector 750, a second delay model unit 760 and second direct phase detector 770.

The buffer 710 receives an external clock signal (ext_clk) and generates a first internal clock signal which becomes activated at an edge of a clock. The first internal clock signal is inputted to the delay line unit 720.

The delay line unit 720 receives the first internal clock signal and also receives a first and second detection signals from the first and second direct phase detector 750 and 770. The delay line unit 720 delays the first internal clock signal based on the first and second detection signals and outputs a first delay internal clock signal (intclk1) and a second delayed internal clock signal (intclk2) to the duty error controller 730.

The delay line unit 720 includes a first controller 721, a first delay line 722, a second controller 723 and a second delay line 724.

The first controller 721 generates a first control signal for controlling a delay amount based on the first detection signal and outputs the first control signal to the first delay line 722.

The delay line 722 receives the first control signal and the first internal clock signal. The first internal clock signal is delayed according to the first control signal in the: delay line 722. That is, the delay line 722 generates the first delayed internal clock signal (intclk1) by delaying the first internal clock signal according to the first control signal. The first delayed internal clock signal intclk1 is outputted to the duty error controller 730.

The second controller 723 generates a second control signal for controlling a delay amount based on the second detection signal and output the second control signal to the second delay line 724.

The second delay line 724 receives the second control signal and the first internal clock signal. The second delay line 724 delays the first internal clock signal based on the second control signal. By delaying the first internal clock signal, the second delay line 724 generates a second delayed internal clock signal. The second delay clock signal is reversed and a reversed second delayed internal clock signal (intclk2) is outputted to the duty error controller 730.

The duty error controller 730 receives the intclk1 and the intclk2 from the delay line unit 720 and produces a first and second duty corrected clock signal (int_clk and intclk2') by shifting falling edges of the intclk1 and intclk2 for matching. The first duty corrected clock signal (int_clk) is outputted to the first delay mode unit 740 and the second duty corrected clock signal (intclk2') is outputted to the second delay mode unit 760. The first duty controlled clock signal (int_clk) is also outputted to the DLL apparatus of the present invention as an internal clock signal of a memory system, which includes the DLL apparatus of the present invention.

The duty error controller 730 includes a first phase mixer 731, first phase mixer 732, a second phase detector 733 and a mixer controller 734.

The first phase mixer 731 receives a weight (k) and applies a value of subtracting weight (k) from 1 to the first delayed internal clock signal (intclk1). The first phase mixer 731 also applies the weight (k) to the second delayed internal clock signal (intclk2). As a result, the first phase mixer 731 produces a first duty controlled clock signal (int_clk) and outputs the first duty controlled clock signal (int_clk) to the first delay model unit 740.

The second phase mixer 732 receives a weight (k). The weight (K) is applied to the first delayed internal clock signal (intclk1) and a value of subtracting the weight from 1 is applied to the second delayed internal clock signal (intclk2). As a result, the second phase mixer 732 produces a second duty controlled clock signal and output the second duty controlled clock signal (intclk2') to the second delay model unit 760.

The first duty controlled clock signal (int_clk) and the second duty controlled clock signal (intclk2') are reversed and inputted to the first phase detector 733. Based on the first and second duty controlled clock signals, the first phase detector 733 produces a phase detect signal indicating one having a preceded falling edge between falling edges of the first duty controlled clock signal (int_clk) and the second duty controlled clock signal (intclk2'). The first phase detector 733 outputs the phase detect signal to the mixer controller 734.

The mixer controller 734 determines a weight (k) according to the phase detect signal and output the weight (k) to the first phase mixer 731 and the second phase mixer 732. The mixer controller 734 continuously controls the weight (k) until two falling edges of the intclk1 and intclk2 are matched.

The first delay model unit 740 receives the first duty controlled clock signal(int_clk) and estimates a delay amount generated during the first duty controlled clock signal travels to a data input/output pin. The first delay model unit 740 generates a first compensated clock signal (iclk1) based on the estimated delay difference and outputs the first compensated clock signal to the first direct phase detector 750.

The first direct phase detector 750 receives the external clock signal (ext_clk) and generates the first detection signal by comparing the external clock signal (ext_clk) with the first compensated clock signal (iclk1). The first direct phase detector 750 outputs the first detection signal to the delay line unit 720.

The second delay model unit 760 receives the second duty controlled clock signal(intclk2') and estimates a delay amount generated during the second duty controlled clock signal travels to a data input/output pin. The second delay model unit 760 generates a second compensated clock signal (iclk2) based on the estimated delay difference and outputs the second compensated clock signal to the second direct phase detector 770.

The second direct phase detector 770 receives the external clock signal (ext_clk) and generates the second detection signal by comparing the external clock signal (ext_clk) and the second compensated clock signal (iclk2). The second direct phase detector 770 outputs the second detection signal to the delay line unit 720.

Figure 8A:
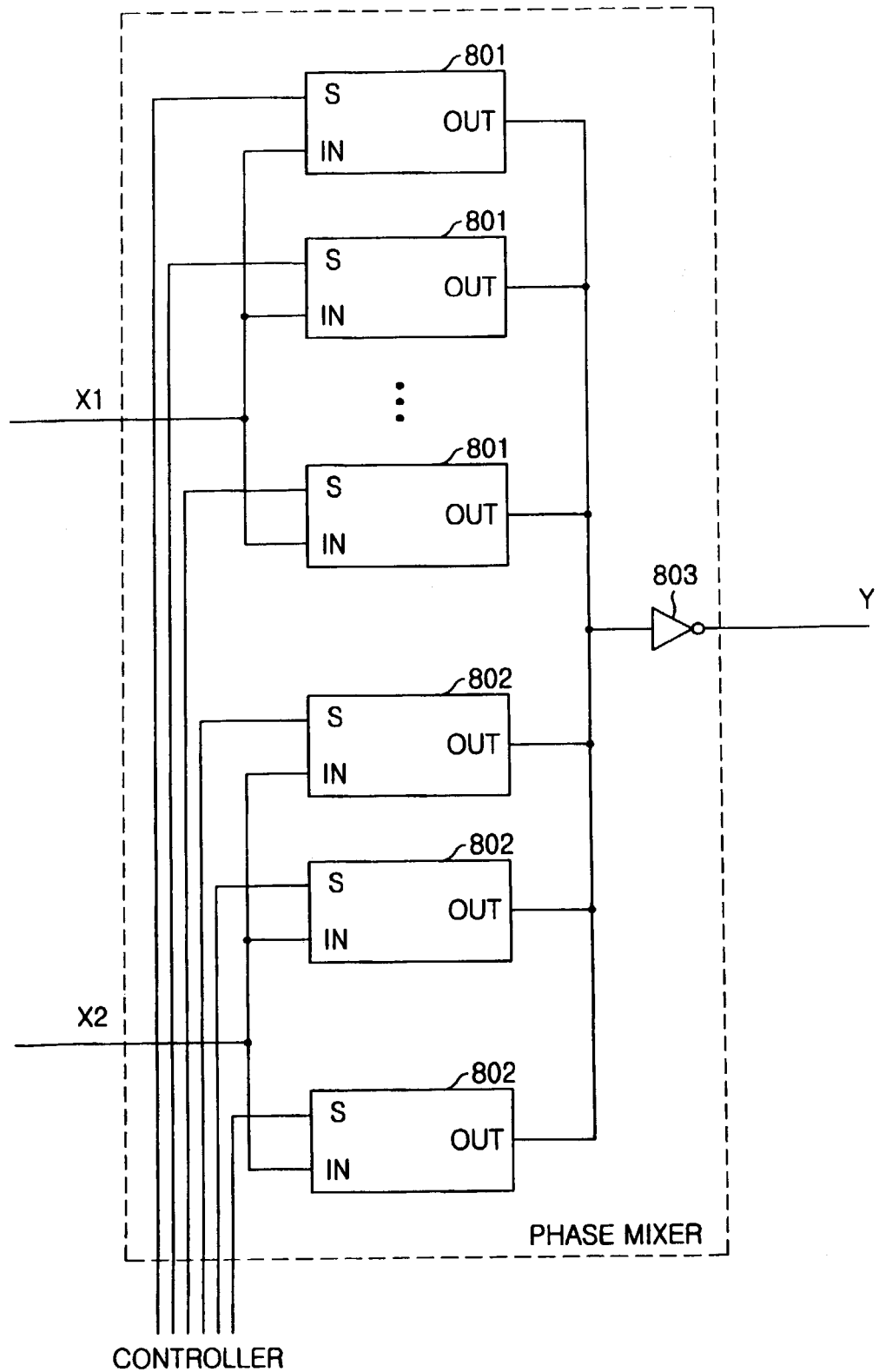
FIGS. 8A and 8B are diagrams depicting the phase mixers of FIG. 7.
Figure 8B:
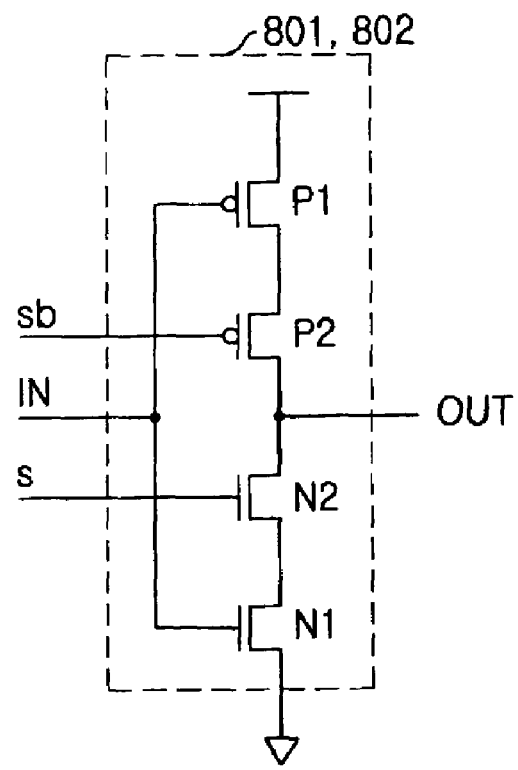
Figure 8C:
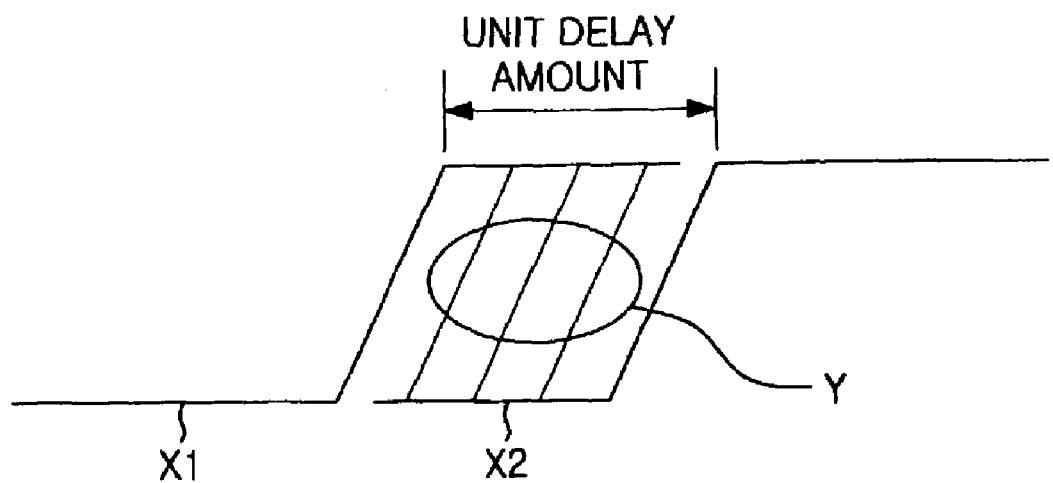
FIG. 8C is a view explaining operation of phase mixers in accordance with a preferred embodiment.

FIGS. 8A and 8B are block diagrams showing a phase mixer and FIG. 8C is a circuit diagram explaining operations of the phase mixer in the FIG. 8A. The phase mixer in FIG. 8A is used as the third and fourth phase mixers 502 and 602 in FIGS. 4 and 6. The phase mixer is explained in detail below.

The third and fourth phase mixer receive two delayed clock signals as a first mixer input signal and a second mixer input signal from the MUX 601 in FIG. 6 and the coarse delay line 401 in FIG. 4. Referring to FIG. 4, the first internal clock signal is inputted to the coarse delay line 401 and it is passed two divided lines of unit delay cells. Two divided lines in unit delay cells generate two delayed clock signals. The two delayed clock signals have a delay difference and are inputted to the third phase mixer 402. In case of the fourth phase mixer 602, the phase delayed clock signals are inputted to the MUX 601. The MUX selects two neighbor clock signals having a delay difference as much as a delay amount of one delay unit cell. The two neighbor clock signals are inputted to the fourth phase mixer 602 as the first mixer input signal and the second mixer input signal.

Referring to FIG. 8A, the phase mixer includes a plurality of first mixing cells 801 and a plurality of second mixing cells 802.

A plurality of first mixing cells 801 receives control signals from the controllers 321, 324, 522, 524 to a first input end S and receives a first mixer input signal X1 to second input end IN. The plurality of first mixing cells 801 outputs a signal High-Z when the control signal is low and when the control signal is high, the plurality of first mixing cells 801 inverses the first mixer input signal and output an inversed first mixer input signal X1.

A plurality of second mixing cells 802 receives control signals from the controllers 321, 324, 522, 524 to a first input end S and receives a second mixer input signal X2 to second input end IN. The plurality of second mixing cells 802 outputs a signal High-Z when the control signal is high and when the control signal is low, the plurality of second mixing cells 802 reverses the second mixer input signal X2 and outputs the reversed second mixer input signal X2.

Two plurality of mixing cells 801 and 802 receives two signals X1 and X2, which have differently delayed, and outputs the selected mixer input signal, which has mediate phase of two signals X1 and X2 according to the control signals to the duty error controller 330 or 530. The phase of the selected mixer input signal can be controlled to be any of phases between two signals X1 and X2 by the control signals.

FIG. 8B is a detailed diagram showing a mixing cell in FIG. 8A in accordance with the disclosed embodiments.

Referring to FIG. 8B, the plurality of first and second mixing cells 801 and 802 includes a first PMOS transistor P1, a second PMOS transistor P2 a first NMOS transistor N1 and a second NMOS transistor N2.

The first PMOS transistor P1 includes a source port and a gate port. The source port is coupled to an electric voltage and one of the first and second mixer input signals received to the gate port.

The second PMOS transistor P2 includes a source port, a drain port and a gate port. The source port of the second PMOS transistor P2 is coupled to a drain ort of the first PMOS transistor P1, the drain port is coupled to an output port OUT. The gate port receives a reversed control signal (sb) by reversing the control signal.

The first NMOS transistor N1 includes a source port and a gate port. The source port is coupled to a ground and one of the first and second mixer input signals are inputted to the gate port.

The second NMOS transistor N2 includes a source port, a drain port and a gate port. The source port is coupled to the drain port of the first NMOS transistor N1, the control signal (s) is received to the gate port and the drain port is coupled to an output port OUT.

FIG. 8C is a view illustrating operation of the phase mixers 402 and 602 of FIGS. 4 and 6. The phase mixer receives the first mixer input signal X1 and the second mixer input signal X2 and outputs a clock signal Y having mediate phase of the first and second mixer input signals. In other word, the phase mixer finely divides a phase between the X1 and X2 and outputs a signal having one of phase among finely divided phases in between the phases of the X1 and X2 according to the control signal.

Figure 9A:
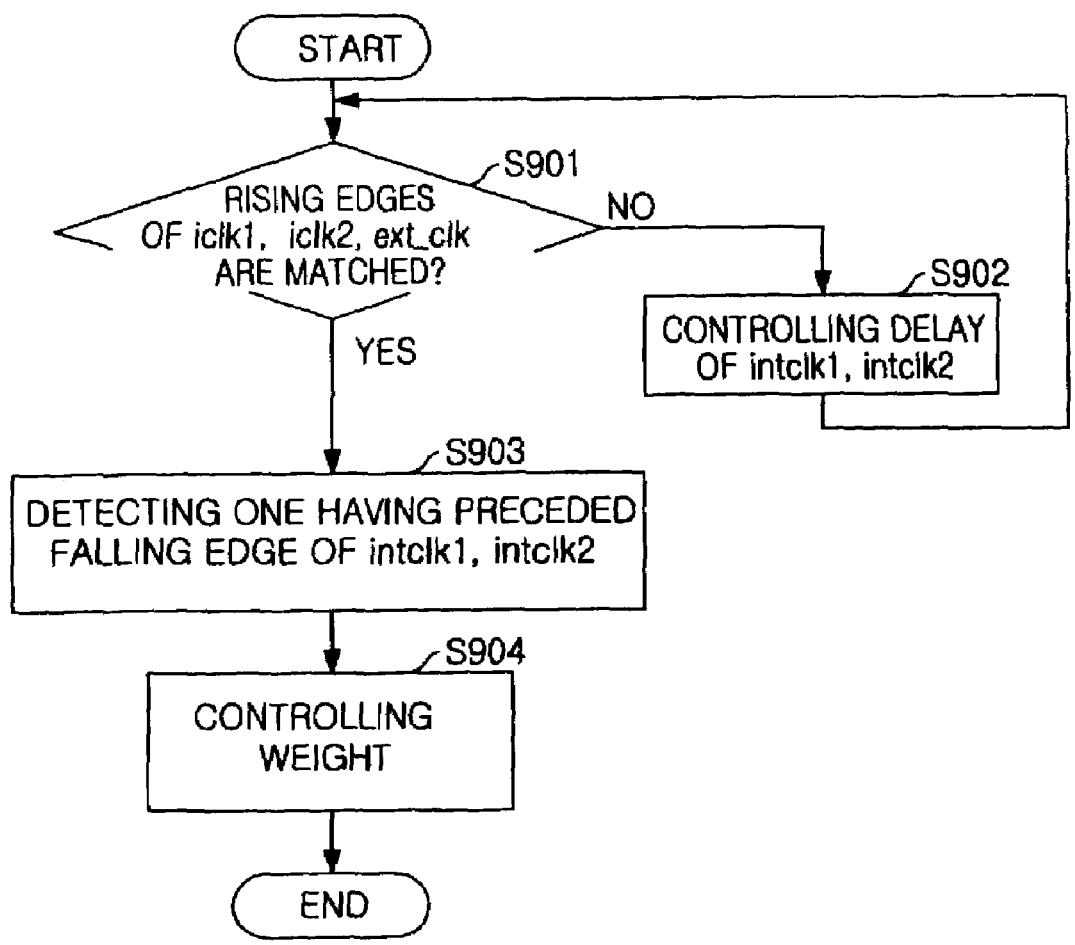
FIGS. 9A and 9B are flowcharts explaining a method for correcting duty cycle of a digital DLL apparatus in accordance with a preferred embodiment.
Figure 9B:
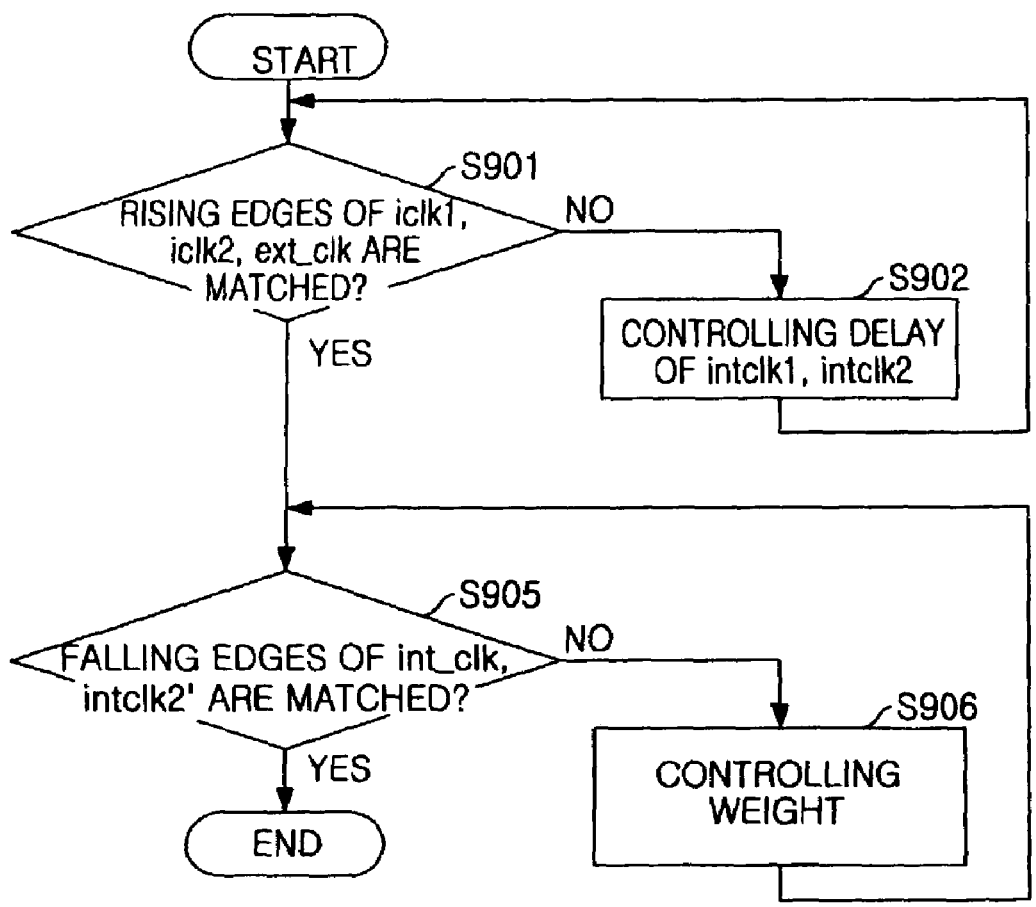

FIGS. 9A and 9B is a flowchart explaining a preferred method for correcting duty cycle of a digital DLL apparatus. A detailed explanation is explained in below.

At first, a first direct phase detector 150 and a second direct phase detector 170 determine whether rising edges of an external clock signal (ext_clk) with a first compensated clock signal (iclk1) or a second compensate clock signal (iclk2) are matched at step 901. If they are matched, the method goes to next step 903. If they are not matched, a delay line unit 120 controls an amount of delay at step 902 and the method goes to step 901.

Next, a first phase detector 131 receives a first delayed internal clock signal (intclk1) and a second delayed internal clock signal (intclk2) and selects one having a preceded falling edge of the intclk1 and intclk2 at step 903. A value bigger than 0.5 is applied to the selected signal as a weight and a value less than 0.5 is applied to the signal is not selected between the intclk1 and intclk2 at step 904.

At step 905, a second phase detector receives a first duty controlled clock signal (int_clk) and a second duty controlled clock signal (intclk2') and determines whether falling edges of two received signals are matched. If they are matched, the method is ended and if they are not matched, a weight value more than 0.5 is applied to a signal having preceded falling edge between the first duty controlled clock signal (int_clk) and the second duty controlled clock signal (intclk2') and a weight value less than 0.5 is applied to a signal having following falling edge between the first duty controlled clock signal (int_clk) and the second duty controlled clock signal (intclk2') at step 906. After applying the value to the signals, a process step of the method goes back to a step 905 for determining whether falling edges are matched.

As mentioned above, the disclosed circuitry and mekthods can correct a duty error by using the phase mixer and generate an internal clock signal having 50% of duty cycle.

While the disclosed circuitry and methods have been described with respect to certain preferred embodiments, it will be apparent to those skilled in the art that various changes and modifications may be made without departing from the scope of this disclosure which is limited only by the following claims.

What is claimed is:

1. A digital DLL apparatus for correcting a duty cycle, comprising:
    a buffer for receiving an external clock signal in order to output a first internal clock signal activated at an edge of the external clock signal;
    a delay line unit for receiving the first internal clock signal from the buffer, a first detection signal and a second detection signal to output a first delayed internal clock signal by delaying the first internal clock signal according to the first detection signal, and a second delayed internal clock signal by delaying the first internal clock signal according to the second detection signal;
    a duty error controller for receiving the first and a second delayed internal clock signals to output a first duty controlled clock signal and second duty controlled clock signal by shifting each edge of the first and second delayed internal clock signals in order to match;
    a first delay model unit for receiving the first duty controlled clock signal which travels to a data input/output pin to output a first compensated clock signal by compensating for a difference between the external clock signal and the first duty controlled clock signal;
    a first direct phase detector for receiving the external clock signal, generating the first detection signal by comparing the external clock signal and the first compensated clock signal and outputting the first detection signal to the delay line unit;
    a second delay model unit for receiving the second duty controlled clock signal which travels to a data input/output pin to output a second compensated clock signal by compensating for a difference between the external clock signal and the second duty controlled clock signal; and
    a second direct phase detector for generating the second detection signal by comparing the external clock signal and the second compensate clock signal to output the second detection signal to delay line unit.

2. The apparatus as recited in the claim 1, wherein the delay line unit comprises:
    a first controlling means for generating a first control signal for controlling a delay amount according to the first detection signal;
    a first delay line for receiving the first control signal and the first internal clock signal to generate the first delayed internal clock signal by delaying the first internal clock signal according to the first control signal;
    a second controlling means for generating a second control signal for controlling a delay amount according to the second detection signal; and
    a second delay line for receiving the second control signal and the first internal clock signal to generate the second delayed internal clock signal by delaying the first internal clock signal according to the second control signal and reversing the delayed clock.

3. The apparatus as recited in claim 1, wherein the duty error controller comprises:
    a first phase detector for receiving the first delayed internal clock signal and the second delayed internal clock signal to generate a phase detect signal by selecting one signal having a preceded falling edge of the first delayed internal clock signal and second delayed internal clock signal;
    a mixer controller for determining a plural number of weights according to the phase detect signal and outputting the plural number of weights;
    a first phase mixer for generating the first duty controlled clock signal by receiving the weights and outputting the first duty controlled clock signal to the first delay model unit, wherein the first duty controlled clock signal is created by applying a value of subtracting the weights from 1 to the first delayed internal clock signal, and applying the weights to the second delayed internal clock signal; and
    a second phase mixer for generating the second duty controlled clock signal receiving the weights and outputting the second duty controlled clock signal to the second delay model unit, wherein the second duty controlled clock signal is created by applying the weights to the first delayed internal clock signal and applying a value of subtracting the weights from 1 to the delayed internal second clock signal.

4. The apparatus as recited in claim 1, wherein the duty error controller comprises:
    a first phase detector for receiving and reversing the first duty controlled clock signal and the second duty controlled clock signal and generating a phase detect signal by selecting one having a preceded falling edge of the first duty controlled clock signal and the second delayed internal clock signal;
    a mixer controller for determining and outputting a weight according to the phase detect signal inputted from the first phase detector;
    a first phase mixer for receiving the weight and generating the first duty controlled clock signal by applying a value of subtracting the weight from 1 to the first delayed internal clock signal and applying the weight to the second delayed internal clock signal; and
    a second phase mixer of receiving the weight and generating the second duty controlled clock signal by applying the weight to the first delayed internal clock signal and applying a value of subtracting the weight from 1 to the second delayed internal clock signal.

5. The apparatus as recited in claim 1, wherein the delay line unit comprises:
    a third controlling means for generating a first shift signal which controls a delay amount according to the first detection signal and outputting the generated first shift signal;
    a first shift register for receiving the first shift signal and outputting the third control signal by generating a third control signal that controls a delay amount by sifting an external clock signal to right or left according to the first shift signal;

a third delay line for receiving the third control signal and the external clock signal, generating the first delayed internal clock signal by delaying the first internal clock signal as much according to the third control signal and outputting the first delayed internal clock signal to the duty error controller;

a fourth controlling means for generating a second control signal that controls a delay amount according to the second detection signal and outputting the second control signal;

a second shift register for receiving the second control signal and generating a fourth control signal that controls a delay amount according to the second control signal; and a fourth delay line for receiving the fourth control signal and the external clock signal, generating the second delayed internal clock signal by delaying the first internal clock signal based on the fourth control signal and reversing the delayed clock, and outputting the second delayed internal clock signal to the duty error controller.

6. The apparatus as recited in claim 5, wherein the fourth delay line comprises:

a coarse delay line having a plurality of unit delay cells, which are coupled in order to generate and output a first mixer input signal and a second mixer input signal, wherein the first mixer input signal and the second mixer input signal have a delay difference based on the number of unit delay cells in the coarse delay line; and a third phase mixer for receiving the first and second mixer input signals from the coarse delay line and tuning minutely the delay amount.

7. The apparatus as recited in claim 5, wherein the third delay line comprises:

a coarse delay line having a plurality of unit delay cells, which are coupled in order to generate and output a first mixer input signal and a second mixer input signal, wherein the first mixer input signal and the second mixer input signal have a delay difference based on the number of unit delay cells in the coarse delay line; and a third phase mixer for receiving the first and second mixer input signals from the coarse delay line and tuning minutely the delay amount.

8. The apparatus as recited in claim 7, wherein the third phase mixer comprises:

a plurality of first mixing cells for receiving a control signal from the third controlling means to a port and the first mixer input signal from the coarse delay line to another port, to output an High-z signal in case that the control signal is low and to output an inverted first mixed input signal in case that the control signal is high;

a plurality of second mixing cells for receiving the second mixer input signal from the coarse delay line to a port and the control signal from the third controlling means to other port, to output an High-z signal in case that the control signal is low and to output an inverted second mixer input signal in case that the control signal is high; and an inverter for reversing an output signal from the plurality of first mixed cell and the plurality of second mixed cell according to the control signal and outputting a reversed output signal to the duty error controlling means.

9. The apparatus as recited in claim 8, wherein the first mixing cell comprises:

a first PMOS transistor having a source port coupled to an electric voltage and a gate port for receiving the first mixer input signal from the coarse delay line as an mixer input signal;

a second PMOS transistor having a source port coupled to a drain port of the first PMOS transistor, a gate port receiving a reversed signal of the control signal and a drain port coupled to the output port;

a first NMOS transistor having a source port coupled to a ground and a gate port receiving the first mixer input signal; and a second NMOS transistor having a source port coupled to a drain port of the first NMOS transistor, a gate port receiving the control signal and a drain port coupled to the output port.

10. The apparatus as recited in claim 8, wherein the second mixed cell comprises:

a first PMOS transistor having a source port coupled to an electric voltage and a gate port for receiving the second mixer input signal from the coarse delay line as an mixer input signal;

a second PMOS transistor having a source port coupled to a drain port of the first PMOS transistor, a gate port receiving a reversed signal of the control signal and a drain port coupled to the output port;

a first NMOS transistor having a source port coupled to a ground and a gate port receiving the second mixer input signal; and a second NMOS transistor having a source port coupled to a drain port of the first NMOS transistor, a gate port receiving the control signal and a drain port coupled to the output port.

11. The apparatus as recited in claim 1, wherein the delay line unit comprises:

a fifth controlling means for generating a fifth control signal that controls a delay amount according to the first detection signal;

a plurality of delay cells for receiving the first internal clock signal from the buffer and generating a plurality of phase delayed signals by passing the first internal clock signal through the plurality of delay cells;

a first signal generating means for generating the first delayed internal clock signal by selecting and tuning two neighbor phase delayed signals among the plurality of the phase delayed signals according to the fifth control signal, to output the first delayed internal clock signal to the duty error controller;

a sixth controlling means for generating a sixth control signal that controls a delay amount according to the second detection signal and outputting the sixth control signal; and a second signal generating means for generating the second delayed internal clock signal by selecting and tuning two neighbor phase delayed signals among the plurality of the phase delayed signals according to the sixth control signal, to output the second delayed internal clock signal to the duty error controller.

12. The apparatus as recited in claim 11, wherein the second signal generating means comprises:

a MUX for receiving the plurality of phase delayed signals and selecting two neighbor phase delayed signals, which have a difference of delay amount as much as one unit delay cell, among the plurality of phase delayed signals according to sixth control signal; and a fourth phase mixer for mixing the two neighbor phase delayed signals from the MUX in order to generate the second delayed internal clock signal by matching the phase of the two neighbor phase delayed signals and outputting the second delayed internal clock signal.

13. The apparatus as recited in claim 11, wherein the first signal generating means comprises;
   a MUX for receiving the plurality of the phase delayed signals and selecting two neighbor phase delayed signals, which have a difference of delay amount as much as one unit delay cell, among the plurality of the phase delayed signals according to fifth control signal; and
   a fourth phase mixer for mixing the two neighbor phase delayed signals from the MUX in order to generate the first delayed internal clock signal by matching the phase of the two neighbor phase delayed signals and outputting the first delayed internal clock signal.

14. The apparatus as recited in claim 13, wherein the fourth phase mixer comprises:
   a plurality of first mixing cells for receiving a control signal from the fifth controlling means to a port and the first mixer input signal from the MUX to another port, to output an High-z signal in case that the control signal is low and to output an inverted first mixer input signal in case that the control signal is high;
   a plurality of second mixing cells for receiving the second mixer input signal from the MUX to a port and the control signal from the fifth controlling means to other port, to output an High-z signal in case that the control signal is low and to output an inverted second mixer input signal in case that the control signal is high; and
   an inverter for reversing an output signal from the plurality of first mixed cell and the plurality of second mixed cell according to the control signal and outputting a reversed output signal to the duty error controlling means.

15. The apparatus as recited in claim 14, wherein the first mixed cell comprises:
   a first PMOS transistor having a source port coupled to an electric voltage and a gate port for receiving one of the first mixer input signal from MUX as an mixer input signal;
   a second PMOS transistor having a source port coupled to a drain port of the first PMOS transistor, a gate port receiving a reversed signal of the control signal and a drain port coupled to the output port;
   a first NMOS transistor having a source port coupled to a ground and a gate port receiving the first mixer input signal from the MUX; and
   a second NMOS transistor having a source port coupled to a drain port of the first NMOS transistor, a gate port receiving the control signal and a drain port coupled to the output port.

16. The apparatus as recited in claim 14, wherein the second mixed cell comprises:
   a first PMOS transistor having a source port coupled to an electric voltage and a gate port for receiving the second mixer input signal from MUX as an mixer input signal;
   a second PMOS transistor having a source port coupled to a drain port of the first PMOS transistor, a gate port receiving a reversed signal of the control signal and a drain port coupled to the output port;
   a first NMOS transistor having a source port coupled to a ground and a gate port receiving the second mixer input signal from the MUX; and
   a second NMOS transistor having a source port coupled to a drain port of the first NMOS transistor, a gate port receiving the control signal and a drain port coupled to the output port.

17. A method of a digital DLL apparatus for correcting a duty cycle, the method comprising:
   a) determining whether rising edges of an external clock signal are matched with rising edges of a first compensated clock signal and a second compensated clock signal to thereby generate a first delayed internal clock signal and a second delayed internal clock signal;
   b) selecting one signal of the first delayed internal clock signal and the second delayed internal clock signal having a preceded falling as between the first delayed internal clock signal and the second delayed internal clock signal in the case that the rising edges are matched; and
   c) applying a first value larger than or equal to 0 and less than 0.5 to the one of the first delayed internal clock signal and the second delayed internal clock signal, which is not selected at step b) and applying a second value greater than 0.5 and less than or equal to 1 to the one of the first delayed internal clock signal and the second delayed internal clock signal, which is selected at step b).

18. The method as recited in claim 17 further comprising:
   d) controlling a delay amount for matching the rising edges in case that the rising edges are not matched.

19. A method of a digital DLL apparatus for correcting duty cycle comprising:
   a) determining whether rising edges of an external clock signal are matched with rising edges of a first compensated clock signal and a second compensated clock signal to thereby generate a first duty controlled clock signal and a second duty controlled clock signal;
   b) determining whether falling edges of the second duty controlled clock signal and the first duty controlled clock signal are matched in the case that the rising edges are matched; and
   c) where the falling edges are not matched, applying a first value greater than or equal to 0 and less than 0.5 to one of the first duty controlled clock signal and the second duty controlled clock signal, which has a non-preceded falling edge; applying a value greater than 0.5 and less than or equal to 1 to one of the first duty controlled clock signal and the second duty controlled clock signal, which has a preceded falling edge; and going back to the step b) in case the falling edges remain unmatched and ending the method in case that the falling edges are matched.

20. The method as recited in claim 19, further comprising:
   d) controlling a delay amount for matching the rising edges in case that the rising edges are not matched.

* * * * *

UNITED STATES PATENT AND TRADEMARK OFFICE
CERTIFICATE OF CORRECTION

| | | |
|---|---|---|
| PATENT NO. | : 7,057,431 B2 | Page 1 of 1 |
| APPLICATION NO. | : 10/331412 | |
| DATED | : June 6, 2006 | |
| INVENTOR(S) | : Jong-Tae Kwak | |

It is certified that error appears in the above-identified patent and that said Letters Patent is hereby corrected as shown below:

In the Claims:

Column 17, line 1, "sifting" should be -- shifting --.

Column 17, line 52, "an High-z" should be -- a High-z --.

Column 17, line 59, "an High-z" should be -- a High-z --.

Column 18, line 5, "an mixer" should be -- a mixer --.

Column 18, line 23, "an mixer" should be -- a mixer --.

Column 19, line 23, "an High-z" should be -- a High-z --.

Column 19, line 29, "an High-z" should be -- a High-z --.

Column 19, line 41, "an mixer" should be -- a mixer --.

Column 20, line 19, "falling as between" should be -- falling edge as between --.

Signed and Sealed this

Seventh Day of August, 2007

JON W. DUDAS
*Director of the United States Patent and Trademark Office*